United States Patent [19]
Sato et al.

[11] Patent Number: 6,115,833
[45] Date of Patent: Sep. 5, 2000

[54] SEMICONDUCTOR MEMORY TESTING APPARATUS

[75] Inventors: Shinya Sato; Kenichi Fujisaki, both of Gyoda, Japan

[73] Assignee: Advantest Corporation, Tokyo, Japan

[21] Appl. No.: 09/040,724

[22] Filed: Mar. 18, 1998

[30] Foreign Application Priority Data

Mar. 19, 1997 [JP] Japan .................................. 9-066788

[51] Int. Cl.$^7$ .............................. G11C 29/00; G11C 7/00
[52] U.S. Cl. .......................... 714/718; 714/723; 365/201
[58] Field of Search ................... 714/718, 723, 714/27, 42; 365/201; 324/158.1

[56] References Cited

U.S. PATENT DOCUMENTS

| | | | |
|---|---|---|---|
| 5,363,382 | 11/1994 | Tsukakoshi | 714/719 |
| 5,831,989 | 11/1998 | Fujisaki | 714/723 |
| 5,841,785 | 11/1998 | Suzuki | 714/718 |
| 5,909,448 | 6/1999 | Takahashi | 714/719 |
| 5,917,833 | 6/1999 | Sato | 714/718 |

*Primary Examiner*—Hoa T. Nguyen
*Attorney, Agent, or Firm*—Gallagher & Lathrop; David N. Lathrop

[57] ABSTRACT

A semiconductor memory testing apparatus is provided which is capable of storing failure data of many semiconductor memories under test by a small memory capacity. A group of n input terminals $IN_1$–$IN_n$ are provided for each of m failure analysis memory units $13_1$–$13_m$, n being equal to the number of ways n of an interleave operation, and in the low rate test mode, low rate failure data $LFAL_1$–$LFAL_n$ are inputted to all the corresponding input terminals $IN_1$–$IN_n$, respectively. Moreover, a plurality of failure format parts $FLFO_1$–$FLFO_n$ are provided for the memory control part MCON of each of the m failure analysis memory units, n being equal to the number of ways n of an interleave operation, and low rate failure data $LFAL_1$–$LFAL_n$ are stored in n banks BNC#1–BNC#n provided for each memory block MBLK through these n failure format parts $FLFO_1$–$FLFO_n$, respectively.

5 Claims, 8 Drawing Sheets

SEMICONDUCTOR MEMORY TESTING APPARATUS

BACKGROUND OF THE INVENTION

1. Field of the Invention

The present invention relates to a semiconductor memory testing apparatus suitable for testing a semiconductor memory such as a memory formed as an integrated circuit (a semiconductor integrated circuit memory, hereinafter referred to an IC memory), and more particularly, relates to a failure analysis memory for storing test results of an IC memory.

2. Description of the Related Art

FIG. 4 shows a basic construction of a conventional semiconductor memory testing apparatus of this type. The illustrated memory testing apparatus comprises a timing generator 11, a pattern generator (PTN GEN) 12, a waveform shaping device (WAVE SHAPE) 14, a logical comparator (LOGIC COMPA) 16, and a failure analysis memory (FAIL MEM) 13.

The pattern generator 12 generates, when a reference clock generated by the timing generator 11 is supplied thereto, an address signal (ADR), a data signal of a predetermined test pattern (DATA) and a control signal (CNTL) which are to be applied to an IC memory to be tested or under test (hereinafter, also referred to simply as memory under test or MUT) 15. These signals are supplied to the waveform shaping device 14 where they are shaped to waveforms required to test the memory 15, and thereafter the shaped waveforms are applied to the memory under test 15.

The memory under test 15 is controlled in its writing operation in which test pattern data signals (DATA) are written thereinto or its reading operation in which the written data signals are read out thereof by a control signal applied to the memory under test 15 through the waveform shaping device 14, and under the control of this control signal, test pattern data signals supplied from the waveform shaping device 14 are written into the memory under test 15 or the written test pattern data signals are read out thereof. The test pattern data signals written into the memory under test 15 are read out later which are, in turn, supplied to the logical comparator 16 where the read out signals are sequentially compared with expected value pattern data signals (EXP) supplied from the pattern generator 12 one by one, thereby to detect whether there is an anti-coincidenc e or a mismatch between the read out signal and the expected value pattern data signal. By these comparison results, a decision is rendered that the memory under test is a failure memory or a pass (conformable or good) memory.

When there is a mismatch between both signals, a failure signal (FAIL) is outputted from the logical comparator 16 to the failure analysis memory 13 in which a failure data corresponding to this failure signal is stored at an address of the failure analysis memory 13 specified by an address signal (ADR) from the pattern generator 12. In general, when the read out signal coincides with the expected value pattern data signal, the logical comparator 16 generates a pass signal, but a data corresponding to this pass signal is not stored in the failure analysis memory 13.

In such a way, failure data each representing a position of a failure memory cell of the memory under test 15, which have occurred during a sequence of tests, are stored in the failure analysis memory 13. After completion of the tests, a failure analysis of the memory under test 15 is performed with reference to the failure data stored in the failure analysis memory 13. For example, in case such failure data are utilized for relieving the failure memory cells, a failure map is created based on the read out failure data to determine whether the detected failure positions (failure memory cells) can be relieved by relieving means previously provided on the memory under test 15.

If the failure analysis memory 13 has four input/output terminals I/O1, I/O2, I/O3, and I/O4 (the bit width of the memory under test 15 is four bits), and hence a test pattern data signal of four bits is applied to the memory under test 15, the failure analysis memory 13 is arranged or constructed as shown in FIG. 5.

FIG. 5 shows in the block form concrete constructions of the failure analysis memory 13 and the logical comparator 16 shown in FIG. 4 together with the memory under test (MUT) 15. To the memory under test 15 are supplied an address signal and a test pattern data signal of four bits from the pattern generator 12 through waveform shaping device 14, thereby to perform writing of the test pattern data signal in the memory under test 15 and reading of the written test pattern data signal therefrom.

The test pattern data signal of four bits read out of the memory under test 15 is compared with an expected value pattern data signal given from the pattern generator 12 in the logical comparator 16. The logical comparator 16 comprises four logic gates connected to the corresponding input/output terminals I/O1–I/O4 of the memory under test 15 respectively, and outputs a pass signal of logic "1" (H (high) level) indicating that this memory cell is normal when the test pattern data signal read out of the memory under test 15 coincides with the expected value pattern data signal supplied from the pattern generator 12 and outputs a failure signal of logic "0" (L (low) level) indicating that this memory cell is abnormal or failure when both the signals do not coincide with each other. These failure signals FAL1–FAL4 are supplied to the failure analysis memory 13.

The failure analysis memory 13 is constituted, since the bit width of the memory under test 15 is four bits in this example, by four memories each having its data width of one bit connected to the corresponding input/output terminals I/O1–I/O4 of the memory under test 15 respectively, for example, four static RAMs (random access memory, hereinafter referred to as X1SRAM), and the failure data are stored in these four X1SRAMs (X1SRAM$_1$, X1SRAM$_2$, X1SRAM$_3$, X1SRAM$_4$).

In the illustrated example, since the failure signals FAL1–FAL4 outputted from the logical comparator 16 are supplied to chip select terminals /CS of the X1SRAM$_1$, X1SRAM$_2$, X1SRAM$_3$ and X1SRAM$_4$, respectively, an L-logic is inputted to the chip select terminal /CS of each of the X1SRAM$_1$, X1SRAM$_2$, X1SRAM$_3$ and X1SRAM$_4$ only when there is a mismatch between the test pattern data signal and the expected value pattern data signal, thereby to enable that X1SRAM to which the L-logic is inputted. As a result, in synchronism with a write-in command pulse /WE supplied to a write-in terminal /WE of each of the X1SRAM$_1$, X1SRAM$_2$, X1SRAM$_3$ and X1SRAM$_4$ , an H-logic supplied to data input terminals FD0–FD3 of the X1SRAM$_1$, X1SRAM$_2$, X1SRAM$_3$ and X1SRAM$_4$ is written in that X1SRAM at an address specified by an address signal applied to an address terminal An thereof at that time.

In such a manner, the failure data are sequentially written in each of the X1SRAM$_1$, X1SRAM$_2$, X1SRAM$_3$ and X1SRAM$_4$. FIG. 6 shows an example of the format of stored failure data in the failure analysis memory 13.

The above discussed construction and operation of the failure analysis memory 13 are ones which are used in the semiconductor memory testing apparatus in case of testing semiconductor memories operating at a normal rate or speed (relatively low rate). A construction or configuration for testing semiconductor memories operating at a high rate or speed is also added to the semiconductor memory testing apparatus.

Specifically, the construction added to the semiconductor memory testing apparatus is arranged such that a plurality of memories having the same storage capacity and operating at a normal rate are provided in the failure analysis memory 13 for each of the input/output terminals of the memory under test 15, and the plurality of the memories for each input/output terminal are accessed at different time points shifted bit by bit in time, that is, time divisionally operated, thereby to increase the operating rate of the failure analysis memory 13 as a whole so that it can store failure data read out from an IC memory operating at high rate. Such time divisional operation will be referred to as interleave operation hereinafter.

In order to effect the interleave operation, it is necessary in the case shown in FIG. 5 that the memory construction (the construction consisting of $X1SRAM_1$–$X1SRAM_4$) of the failure analysis memory 13 shown in the drawing is provided by the number of time division (hereinafter referred to as the number of ways or phases of interleave). One memory construction is also called a bank, and if the number of ways of interleave is 4, then four banks are needed to be provided. That is, it is necessary to provide four sets of the memory construction consisting of $X1SRAM_1$–$X1SRAM_4$. $X1SRAM_1$–$X1SRAM_4$ of each of the four memory constructions are interleaved (time divisionally operated).

FIG. 7 is waveforms showing an outline of the interleave operation of four ways or phases. Failure data of high rate HFAL read out from a memory under test of high operating rate are distributed to and stored in four banks #1–#4 shown in FIG. 7C in accordance with bank select signals of four phases S1, S2, S3 and S4 shown in FIG. 7B, respectively. Accordingly, $X1SRAM_1$–$X1SRAM_4$ constituting each of the four banks #1–#4 may operate at a period T which is four times as long as the period of the high rate failure data HFAL.

FIG. 8 shows one example of the construction of the conventional failure analysis memory 13 the operation mode of which can be switched to one of the high rate and the low rate so that it can operate in either one of the high rate mode and the low rate mode. In this example, a case is shown in which the failure analysis memory 13 is constituted by a plurality of failure analysis memory units $13_1$–$13_m$.

Assuming that the number of memories under test which can be tested concurrently by the memory testing apparatus is m without distinction of the high rate test mode and the low rate test mode, m failure analysis memory units $13_1$–$13_m$ are provided, too. In addition, each of the m failure analysis memory units $13_1$–$13_m$ has a memory control part MCON and a memory block MBLK provided therein. The memory block MBLK has banks (memory constructions) BNC#1–BNC#n the number of which is equal to that of ways of the interleave operation. In the illustrated example, each memory block has n banks BNC#1–BNC#n in order to make it possible that the interleave operation up to n ways can be effected. Each bank is constituted by a plurality of memories X1SRAMs the number of which is equal to the bit width of a memory under test.

The memory control part MCON comprises a failure format part FLFO, a bank selector part BLSE, an operating frequency register FRG, and a shifter SFT.

The failure format part FLFO cuts or takes out a bit width corresponding to the bit width outputted from the memory under test to supply to the respective banks BNC#1–BNC#n a failure data having the same bit width as the bit width outputted from the memory under test.

The bank selector part BLSE outputs a bank select signal corresponding to the high rate test mode or the low rate test mode. That is, in the low rate test mode, the bank selector part BLSE produces a bank select signal based on a value set in the operating frequency register FRG, and outputs, in accordance with an address signal (commonly a higher bit or bits of the address signal generated from the pattern generator 12 for selecting one of X1SRAMs), this bank select signal to, generally, only the first bank BNC#1 to set that bank BNC#1 in the operation mode.

In the high rate test mode, the shifter SFT operates and the bank selector part BLSE produces bank select signals of multi-phases (see FIG. 7B) the number of which corresponds to that of ways of the interleave operation. The bank select signals of multi-phases are sequentially supplied to the n banks BNC#1–BNC#n one signal for one bank in accordance with the higher bit or bits of the address signal, thereby to effect the interleave operation of the banks BNC#1–BNC#n.

To each of address input terminals An of plural (the number corresponding to the bit width of the memory under test, which is four (4) in this example) X1SRAMs constituting each of the banks BNC#1–BNC#n is supplied the same address signal (commonly a lower bit or bits of the address signal generated from the pattern generator 12) as that supplied to the memory under test 15, and the same address of each X1SRAM as that of the memory under test is accessed by the address signal. In addition, an H-logic is being applied to an data input terminal FD of each X1SRAM, and if a failure data of L-logic is supplied to the chip select terminal /CS (if the data read out of the memory under test 15 does not coincide with the expected value data), an H-logic is written at an address specified by an address signal supplied to the address terminal An at that time.

As described above, heretofore, the semiconductor memory testing apparatus has the construction by which the testing apparatus can operate in either one of the low rate test mode and the high rate test mode. In the low rate test mode, as shown in FIG. 9, the construction is arranged such that the first bank BNC#1 in each memory block MBLK is mainly used, and hence the remaining banks BNC#2–BNC#n in each memory block remain unused.

As a result, in the low rate test mode, the memories prepared in the failure analysis memory 13 are actually used only by a portion thereof, that is, only a memory capacity corresponding to the quotient of the total memory capacity divided by the number of ways of the interleave operation is actually used. Accordingly, the cost (test cost) required for testing IC memories becomes high. For example, in case the number of ways of the interleave operation is 4 as the illustrated example, only memories or memory capacity equal to ¼ of the total memories or memory capacity prepared in the failure analysis memory 13 are actually used, and therefore, the ratio of the cost required for equipping the memory testing apparatus to the number of semiconductor memories that the testing apparatus can test within unit time is large, resulting in high test cost.

Generally, to reduce the cost required for testing semiconductor memories is attained by increasing the number of semiconductor memories that the testing apparatus can test at the same time. However, in practice, the more the number of semiconductor memories that the testing apparatus can test at the same time is increased, the more the amount of memories (memory capacity of the failure analysis memory) which remains unused in the low rate test mode is increased. As a result, the cost required for manufacturing a memory testing apparatus becomes high which results in a disadvantage that the test cost is increased.

SUMMARY OF THE INVENTION

An object of the present invention is to provide a semiconductor memory testing apparatus in which the utilization factor of memory elements constituting a failure analysis memory can be improved up to about 100% even in the low rate test mode whereby failure data of many semiconductor memories under test can be stored in a small number of memory elements.

In accordance with the present invention, in order to attain the above object, there is provided a semiconductor memory testing apparatus including a failure analysis memory for storing failure data resulting from the test results of a semiconductor memory under test, the failure analysis memory comprising a plurality of memory blocks the number of which is equal to the number of semiconductor memories of high operating rate that the testing apparatus can test at the same time in a high rate test mode in which the testing apparatus tests the semiconductor memories of high operating rate, and a plurality of banks provided in each of said plurality of memory blocks and the number of which corresponds to the number of ways of an interleave operation, and the semiconductor memory testing apparatus being characterized in that in a low rate test mode in which the semiconductor apparatus tests semiconductor memories of low operating rate, each of the plurality of banks of each memory block in the failure analysis memory is designated as an area in which is stored failure data of one of semiconductor memories under test that the testing apparatus tests at the same time, and failure data of each semiconductor memory under test is stored in the corresponding one bank.

The failure analysis memory comprises a plurality of failure analysis memory units the number of which is equal to the number of semiconductor memories of high operating rate that the testing apparatus can test at the same time in the high rate test mode, each of the failure analysis memory units comprising a group of input terminals the number of which corresponds to the number of ways of an interleave operation, a memory control part, and a plurality of memory blocks the number of which is equal to the number of semiconductor memories of high operating rate that the testing apparatus can test at the same time in the high rate test mode, and wherein the memory control part includes failure format means the number of which corresponds to the number of ways of an interleave operation, and bank selector means for generating a bank select signal for selecting at least one bank from each of the plurality of memory blocks.

In addition, one input terminal of the input terminal group of the memory control part is directly connected to one of the failure format means, the remaining input terminals thereof are connected to the corresponding remaining failure format means through respective one input terminals of switching means, respectively, and the one input terminal of the input terminal group is also connected to respective the other input terminals of the switching means. Each input terminal of the input terminal group of the memory control part is supplied with low rate failure data of one of semiconductor memories under test that the testing apparatus tests at the same time in the low rate test mode, and the one input terminal of the input terminal group of the memory control part is supplied with high rate failure data of one of semiconductor memories under test that the testing apparatus tests at the same time in the high rate test mode.

In a preferred embodiment, each of the switching means is a multiplexer, and in the high rate test mode, the multiplexers connect only the one input terminal of the input terminal group to the remaining failure format means, and in the low rate test mode, the multiplexers connect the remaining input terminals of the input terminal group to the corresponding remaining failure format means, respectively.

According to the semiconductor memory testing apparatus having the construction mentioned above according to the present invention, particularly in the low rate test mode, since a plurality of banks constituting each memory block are designated as an area in which is stored failure data of one of semiconductor memories under test, about 100% of the total memory capacity of the failure analysis memory can be actually used. As a result, assuming that the number of ways of an interleaving operation is n, and the number of semiconductor memories that the testing apparatus can test at the same time in the high rate test mode is m, by use of a failure analysis memory for storing high rate failure data of m semiconductor memories under test, in the low rate test mode, low rate failure data of (m×n) semiconductor memories can be stored in this failure analysis memory.

As a result, in case the number of semiconductor memories that the testing apparatus can test at the same time in the low rate test mode is increased, it is possible to greatly reduce the amount of the memory capacity or the number of memories which remains unused. Accordingly, an advantage occurs that the utilization factor of memories in a failure analysis memory is improved.

DETAILED DESCRIPTION OF THE PREFERRED EMBODIMENTS

Figure 1:
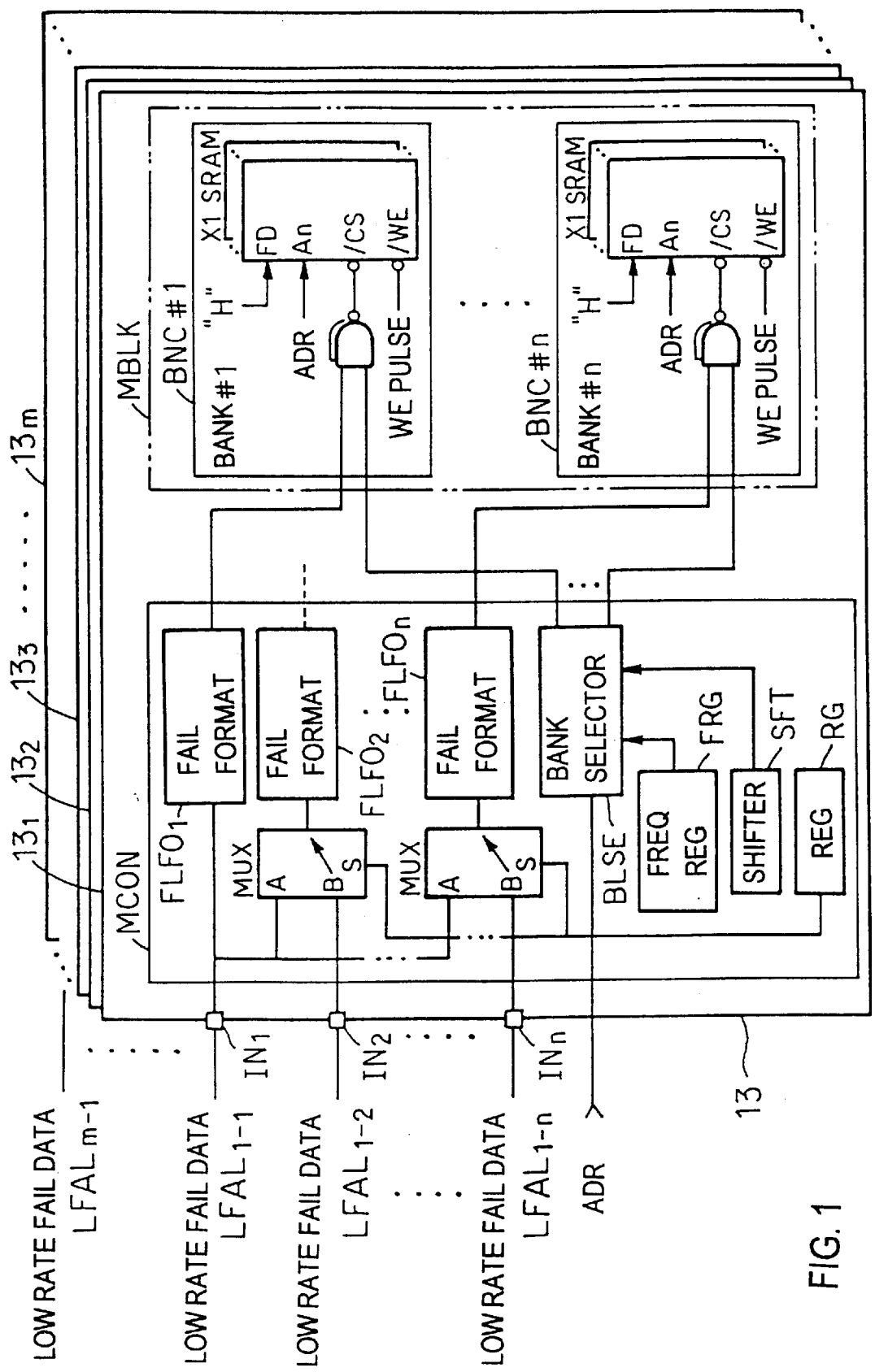
FIG. 1 is a block diagram showing a construction of the failure analysis memory in case an embodiment of the semiconductor memory testing apparatus according to the present invention operates in the low rate test mode.
Figure 2:
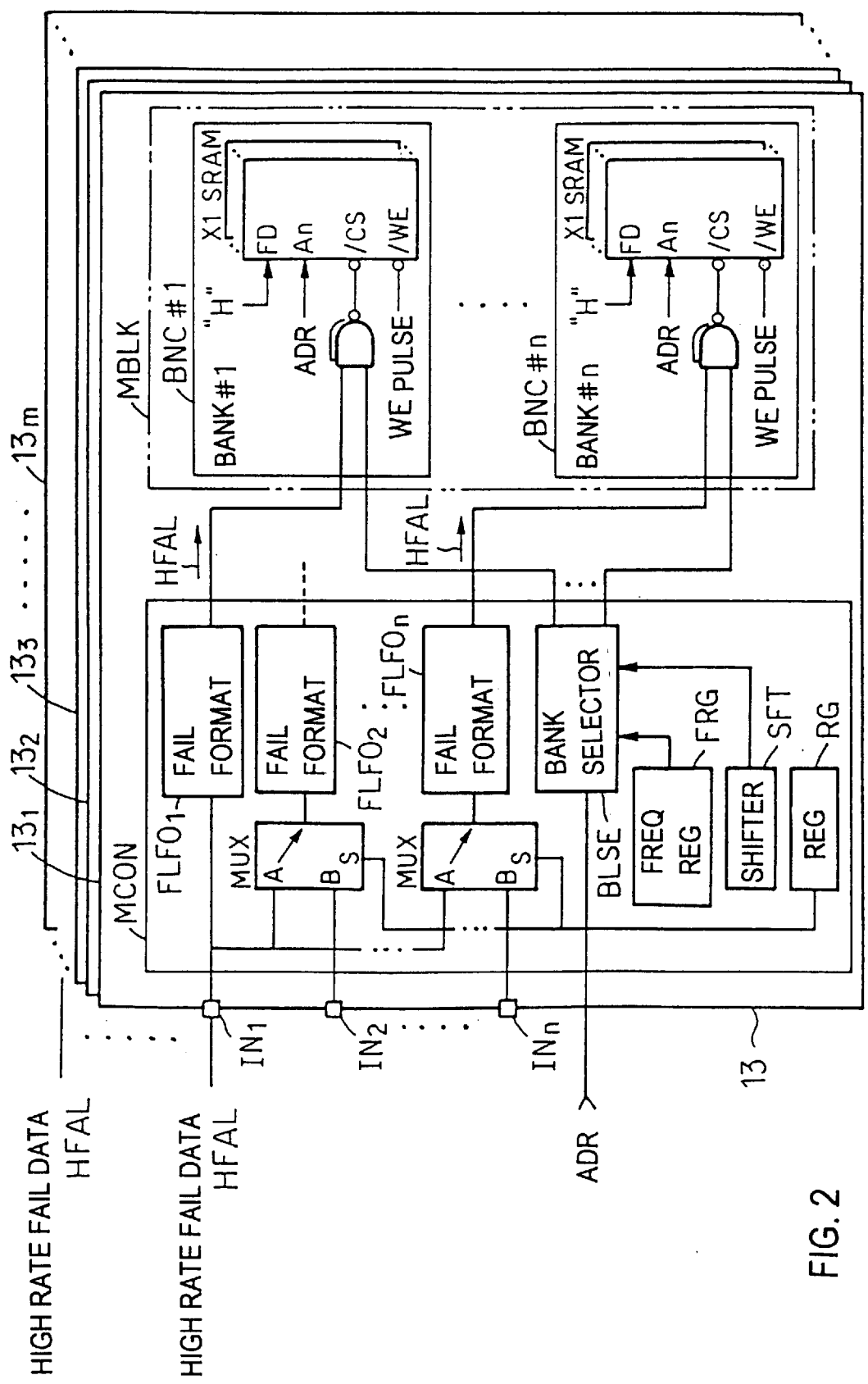
FIG. 2 is a block diagram showing a construction of the failure analysis memory in case the embodiment of the semiconductor memory testing apparatus according to the present invention operates in the high rate test mode.
Figure 8:
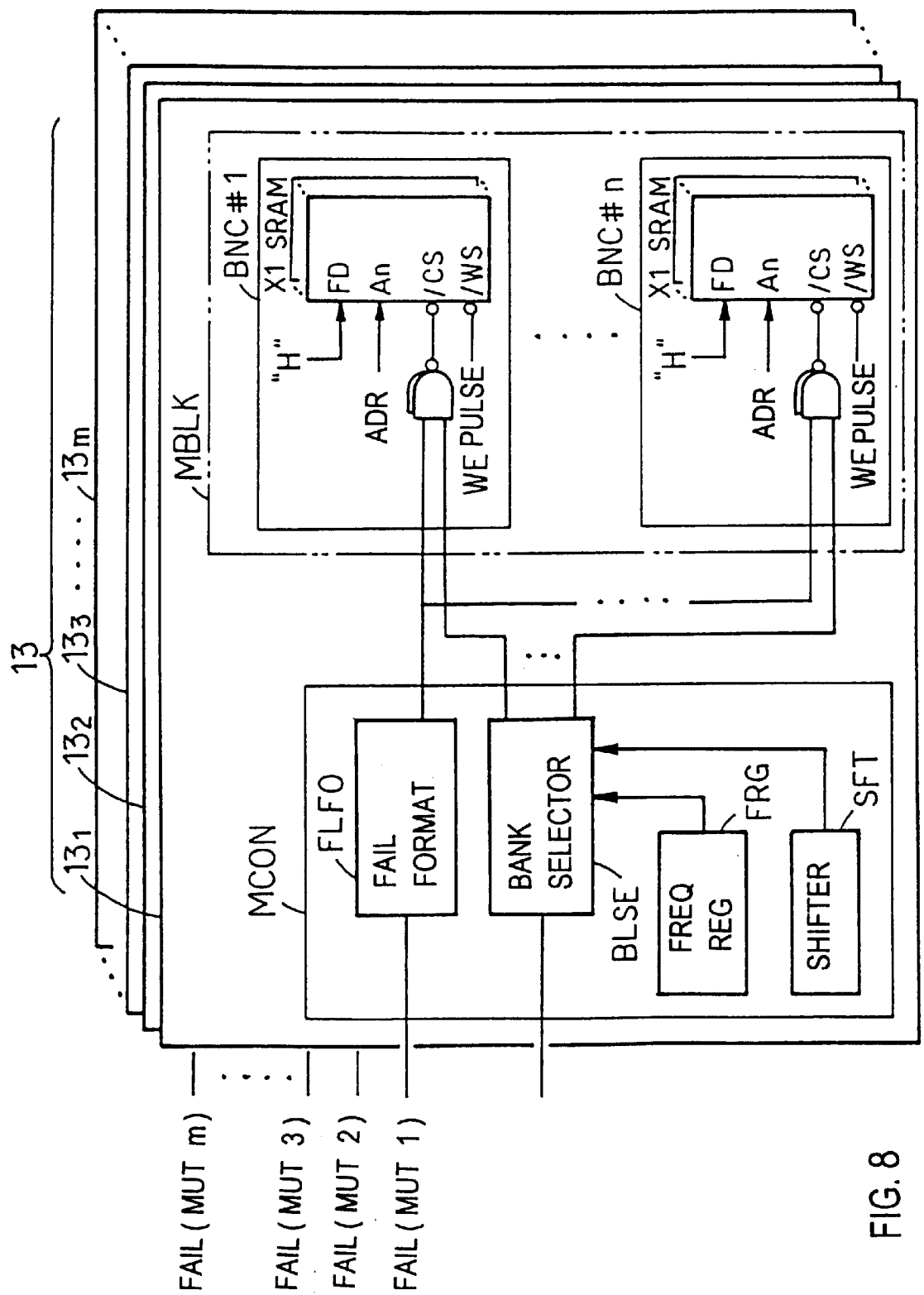
FIG. 8 is a block diagram showing a construction of the conventional failure analysis memory for carrying out an interleave operation.
Figure 9:
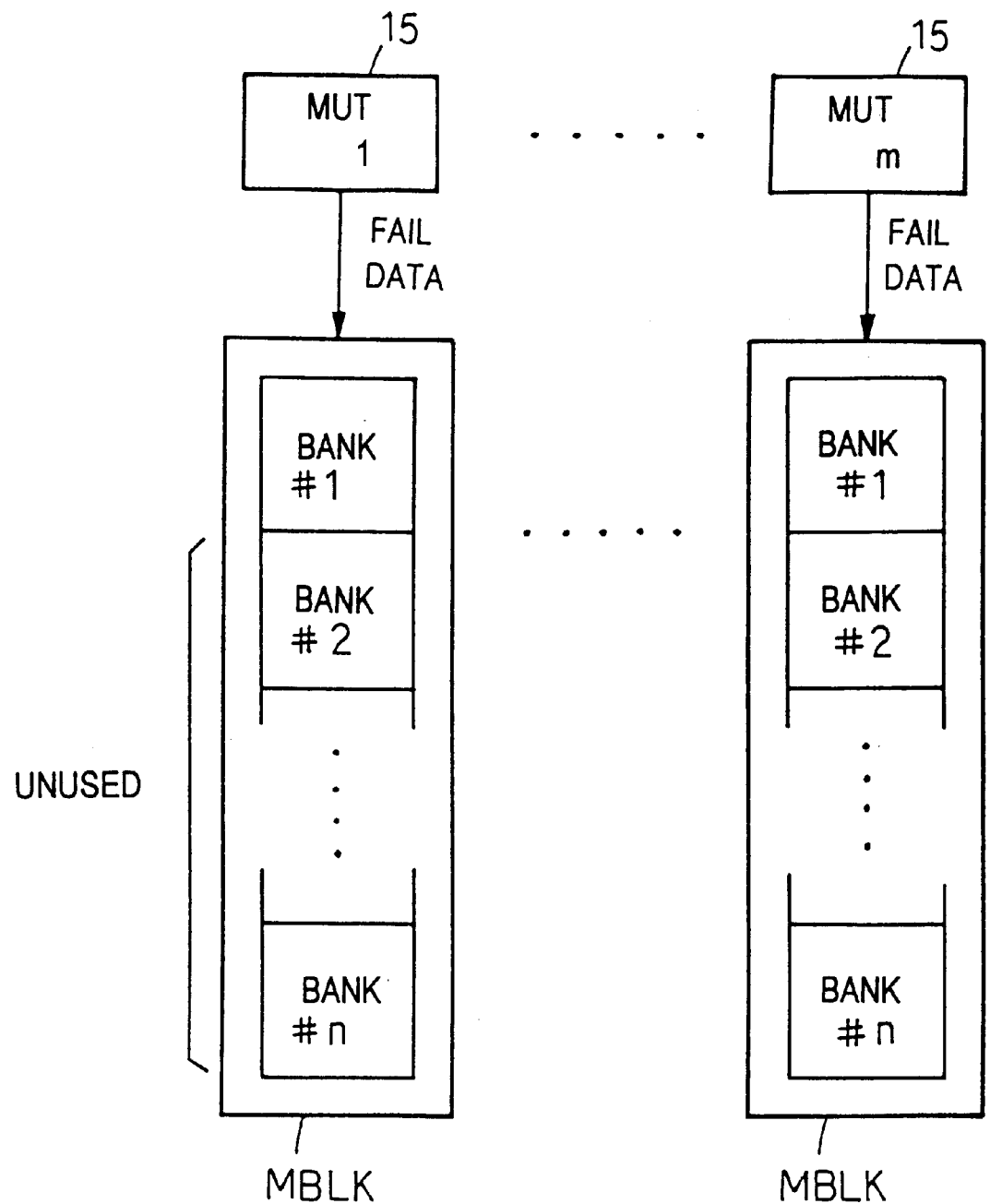
FIG. 9 is a diagram for explaining a drawback of the conventional failure analysis memory which can carry out an interleave operation.

FIG. 1 is a block diagram showing a construction of the failure analysis memory in case an embodiment of the semiconductor memory testing apparatus according to the present invention operates in the low rate test mode. FIG. 2 is a block diagram showing a construction of the failure analysis memory in case the embodiment of the semiconductor memory testing apparatus according to the present invention operates in the high rate test mode. In FIGS. 1 and 2, portions, elements and the like corresponding to those in FIG. 8 are denoted by attaching to them the same characters as in FIG. 8, and the explanation thereof will be omitted unless necessary.

Like the conventional failure analysis memory 13 discussed above with reference to FIG. 8, this embodiment illustrates the same case that the number of semiconductor memories under test, namely, MUTs that the testing apparatus can test concurrently in the high rate test mode is m. Therefore, there are provided in the failure analysis memory 13 m failure analysis memory units $13_1$–$13_m$.

In the present invention, a group of n input terminals $IN_1$–$IN_n$ are provided for each of the m failure analysis memory units $13_1$–$13_m$, n being equal to the number of ways or phases n of an interleave operation, and in the low rate test mode, low rate failure data $LFAL_1$–$LFAL_n$ are inputted to the corresponding input terminals $IN_1$–$IN_n$, respectively.

Moreover, a plurality of failure format parts $FLFO_1$–$FLFO_n$ are provided for the memory control part MCON of each of the m failure analysis memory units $13_1$–$13_m$, n being equal to the number of ways n of an interleave operation, and low rate failure data $LFAL_1$–$LFAL_n$ are stored in the n banks BNC#1–BNC#n provided for each memory block MBLK through these n failure format parts $FLFO_1$–$FLFO_n$, respectively.

Further, each failure analysis memory unit has the same construction or arrangement with one another, and in FIGS. 1 and 2, only the construction of the first failure analysis memory unit $13_1$ is concretely shown as a typical example thereof and the following discussion will be made with reference to this concrete example. In addition, it is assumed that the bit width of the memory under test 15 is also four bits like the above-mentioned memory under test, and that a test pattern data signal (DATA) is four bits and each bank is constituted by four X1SRAMs.

Except the first failure format part $FLFO_1$ of the memory control part MCON of the first failure analysis memory unit $13_1$, the remaining failure format parts $FLFO_2$–$FLFO_n$ have multiplexers MUX provided at the preceding stage (input side) thereof, and the testing apparatus is arranged to be switched between the high rate test mode and the low rate test mode through these multiplexers MUX.

Specifically, the first failure analysis memory unit $13_1$ is arranged such that in the high rate test mode, high rate failure data supplied to the first input terminal $IN_1$ among the n input terminals $IN_1$–$IN_n$ can be applied to the first failure format part $FLFO_1$ as well as the remaining failure format parts $FLFO_2$–$FLFO_n$, and that in the low rate test mode, low rate failure data $LFAL_1$, $LFAL_2$, ..., $LFAL_{1-n}$ supplied to the respective n input terminals $IN_1$–$IN_n$ can be supplied to the corresponding failure format parts $FLFO_1$–$FLFO_n$.

Moreover, a register RG for controlling the set state of the multiplexers MUX is provided in the memory control part MCON. This register RG controls each of the multiplexers MUX such that it selects its input terminal A in the high rate test mode and it selects its input terminal B in the low rate test mode.

The bank selector part BLSE of the memory control part MCON produces, in the low rate test mode, a bank select signal based on a numerical value set in the operating frequency register FRG, and supplies this bank select signal to the n banks BNC#1–BNC#n in accordance with an address signal (a higher bit or bits of the address signal), the number n being equal to the number of ways n of an interleave operation. As a result, the n banks BNC#1–BNC#n are operated in the correspondence of 1:1 to the failure format parts $FLFO_1$–$FLFO_n$.

Accordingly, the n banks BNC#1–BNC#n are concurrently accessed in accordance with an address signal (a lower bit or bits of the address signal) supplied to each of the address terminals An of the four X1SRAMs of each bank, and an H-logic being applied to a data input terminal FD of each X1SRAM is stored in each X1SRAM at an address thereof specified by that address signal every time failure data is supplied thereto.

In the high rate test mode, as shown in FIG. 2, since high rate failure data HFAL is applied to only the first input terminal $IN_1$ among the input terminal group, and each multiplexer MUX is set to select its input terminal A, the high rate failure data HFAL is supplied to all of the failure format parts $FLFO_1$–$FLFO_n$. These failure format parts $FLFO_1$–$FLFO_n$ match the bit width of failure data with the bit width of the inputted high rate failure data HFAL and output the high rate failure data HFAL as they are to the n banks BNC#1–BNC#n.

Figure 7:
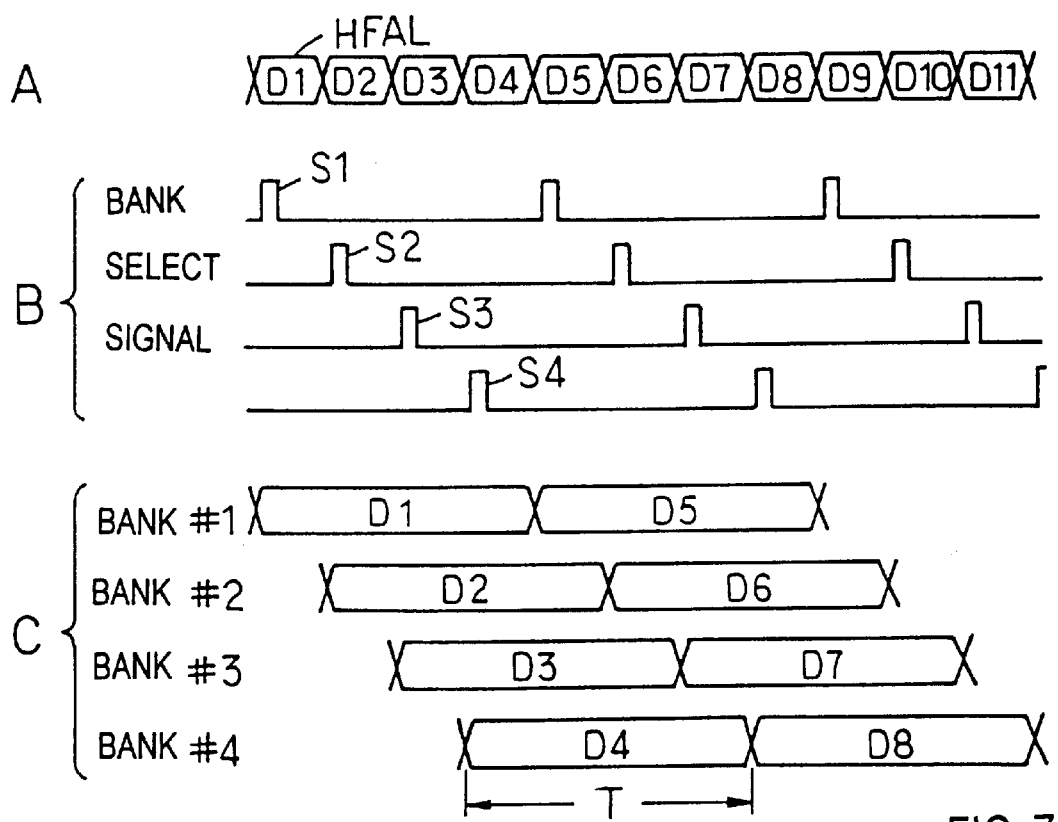
FIG. 7 is waveforms for explaining an interleave operation.

Since bank select signals of multi-phases (n phases in this example) from the bank selector part BLSE as shown in FIG. 7B are sequentially supplied to the n banks BNC#1–BNC#n one signal for one bank, the n banks BNC#1–BNC#n carry out the interleave operation as shown in FIG. 7C so that the high rate failure data HFAL is distributed to and stored in the respective banks BNC#1–BNC#n.

Figure 3:
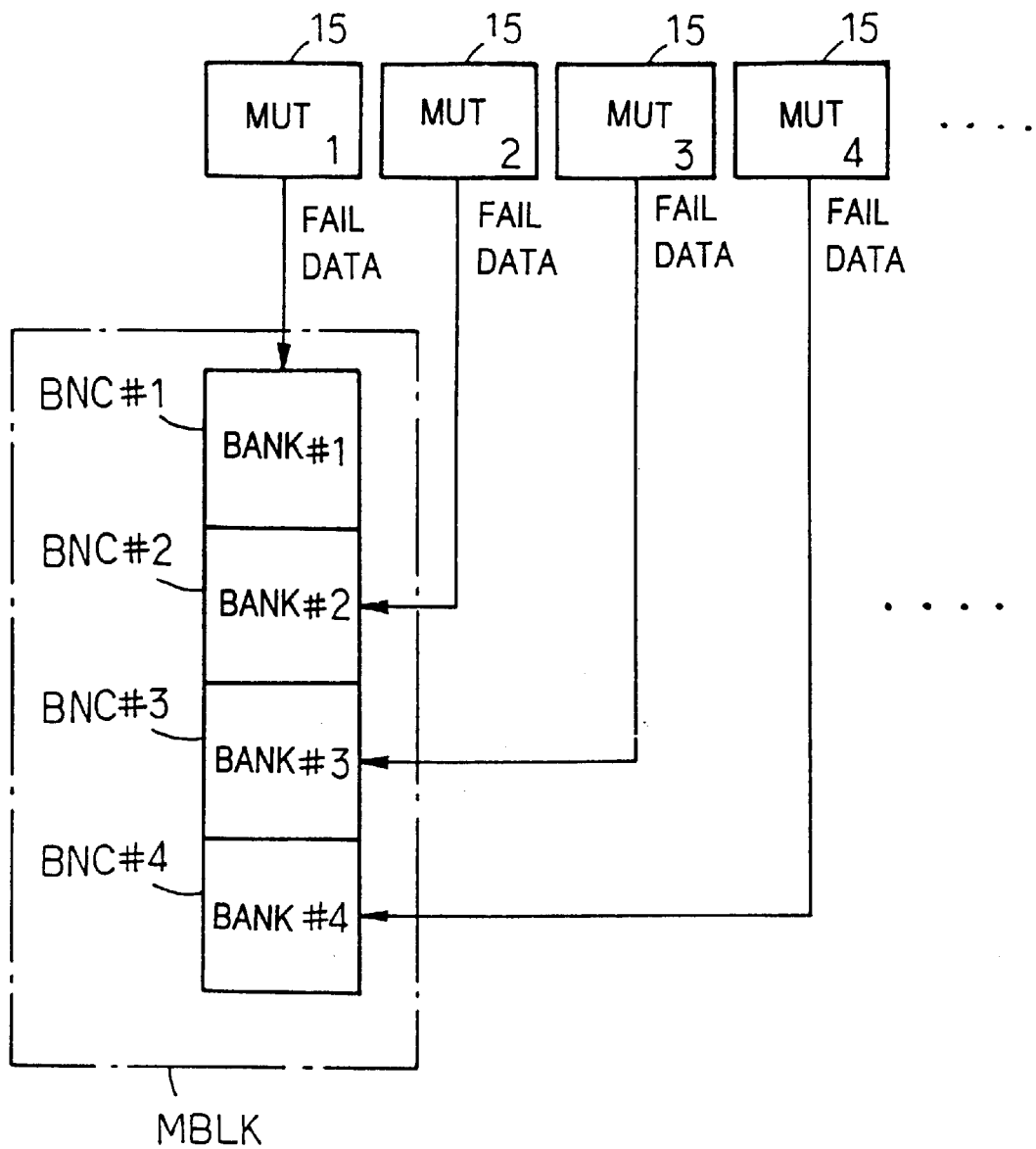
FIG. 3 is a diagram for explaining a technical conception of the main portion of the embodiment of the semiconductor memory testing apparatus according to the present invention.
Figure 4:
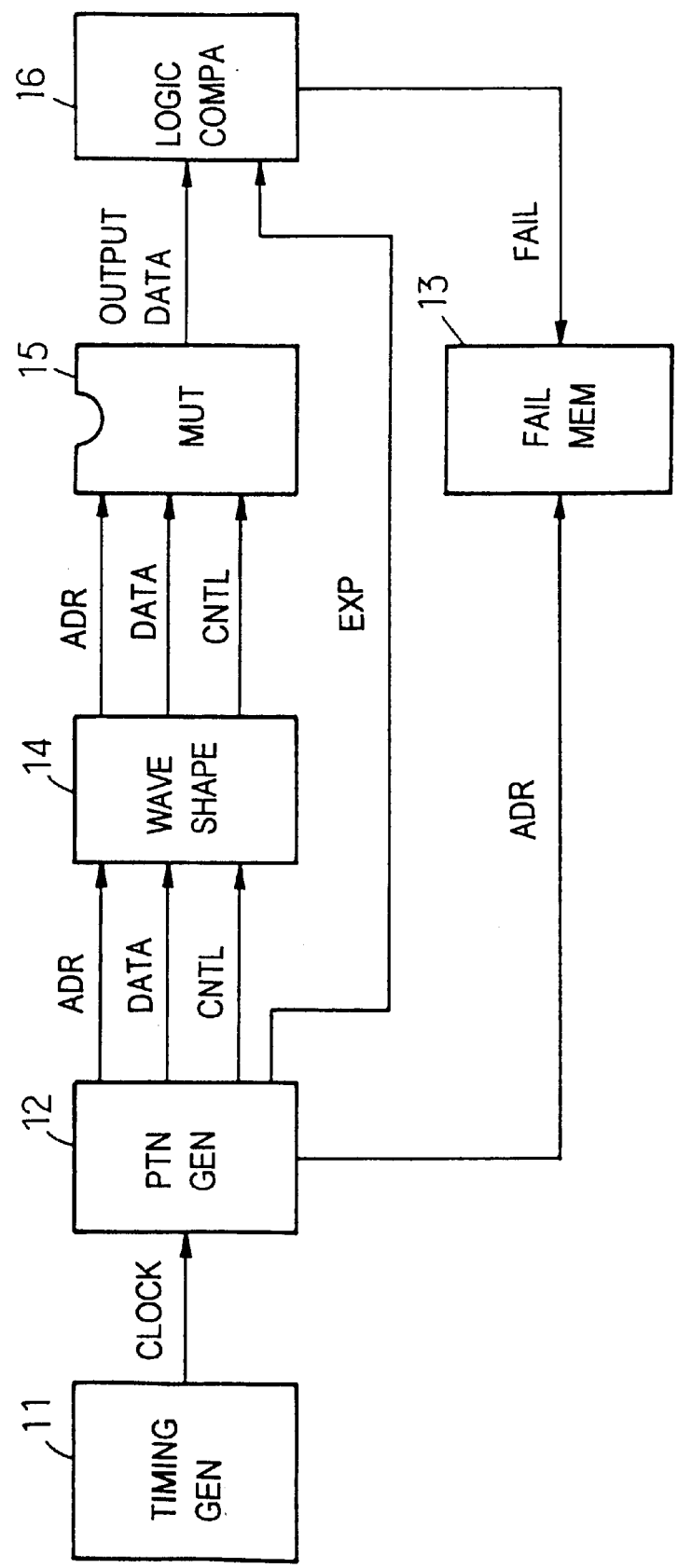
FIG. 4 is a block diagram showing in outline the general construction of one of the conventional semiconductor memory testing apparatus.
Figure 5:
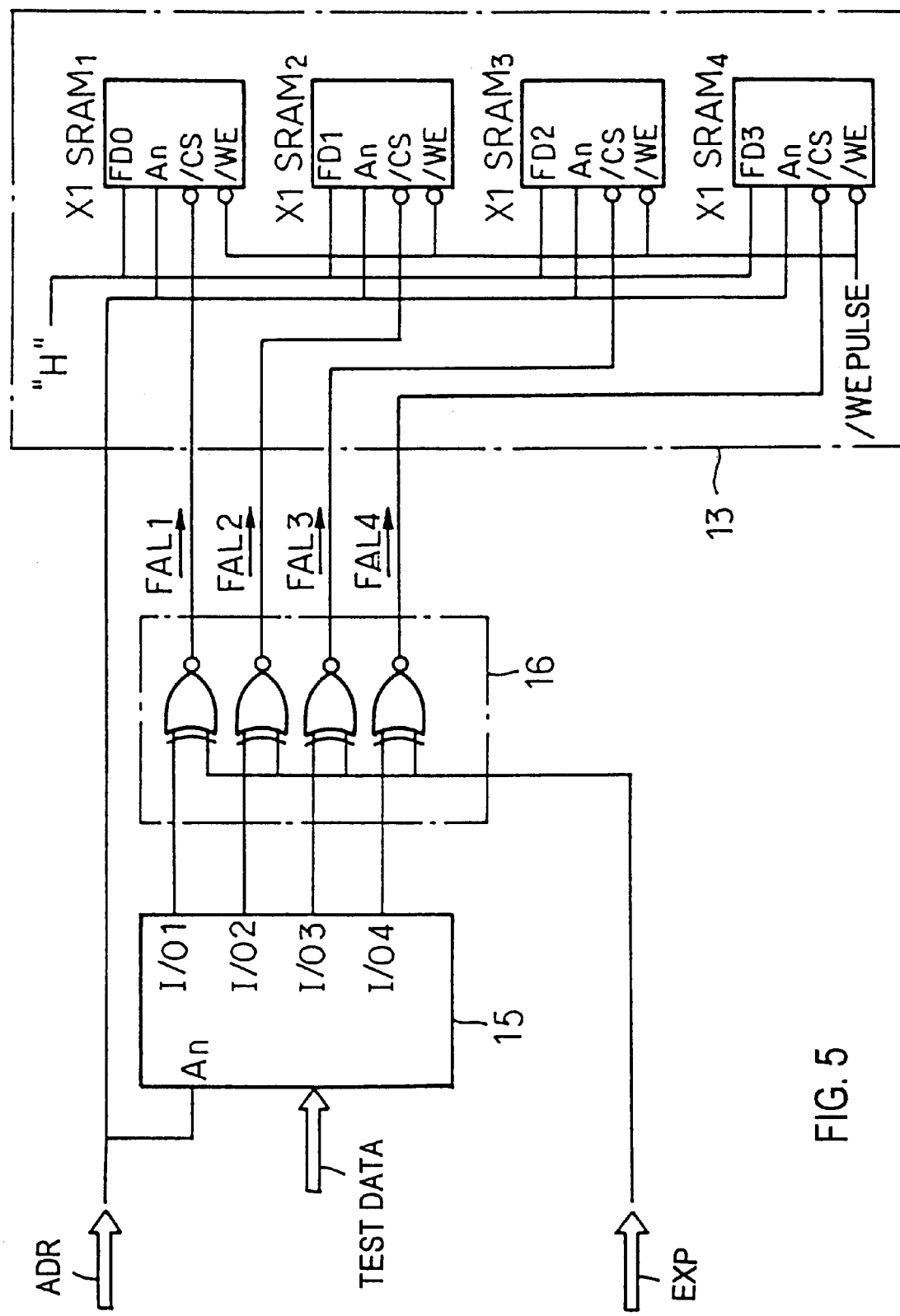
FIG. 5 is a block diagram showing a construction of the failure analysis memory used in the conventional semiconductor memory testing apparatus.
Figure 6:
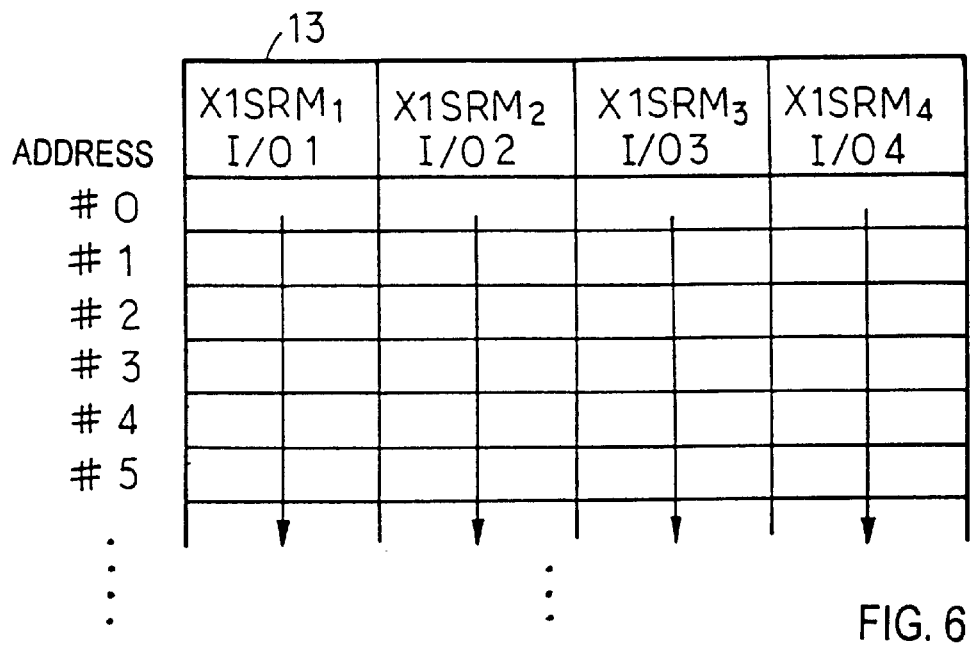
FIG. 6 is a diagram for explaining a format of stored failure data in the failure analysis memory shown in FIG. 5.

By the construction of each of the failure analysis memory units $13_1$–$13_m$ described above, the banks BNC#1–BNC#n of the memory block MBLK provided for each of the failure analysis memory units $13_1$–$13_m$ correspond to semiconductor memories 15 under test in the relation of 1:1 as shown in FIG. 3 in the low rate test mode, and hence they can be utilized as areas in which the respective failure data of the memories 15 under test are stored. Therefore, assuming that the number of semiconductor memories under test that the testing apparatus can test at the same time in the high rate test mode is m, and the number of ways of an interleave operation is n, there can be prepared in the low rate test mode failure analysis memories the number of which is the product of (m×n).

As described above, in the present invention, since the banks BNC#1–BNC#n in each of the m memory blocks MBLK can be used by about 100%, if the same number of semiconductor memories as that in the conventional testing apparatus are concurrently tested in the low rate test mode by the testing apparatus according to the present invention, the memory capacity required for the failure analysis memory can be considerably reduced. In addition, in case the number of semiconductor memories under test that the testing apparatus can test at the same time is increased, since the banks BNC#1–BNC#n in each of the m memory blocks MBLK can be used by about 100%, it is possible to restrain the memory capacity required for the failure analysis memory from being increased. Consequently, if a semiconductor memory testing apparatus is manufactured in which the number of semiconductor memories under test that the testing apparatus can test at the same time in the low rate test mode is increased, the cost needed for the failure analysis memory is restrained from being increased, resulting in an advantage that such memory testing apparatus can be manufactured by low cost.

What is claimed is:

1. A semiconductor memory testing apparatus including a failure analysis memory for storing failure data resulting from the test results of a semiconductor memory under test, said failure analysis memory comprising a plurality of memory blocks the number of which is equal to the number of semiconductor memories of high operating rate that said testing apparatus can test at the same time in a high rate test mode in which said testing apparatus tests said semiconductor memories of high operating rate, and a plurality of banks provided in each of said plurality of memory blocks and the number of which corresponds to the number of ways of an interleave operation, said semiconductor memory testing apparatus being characterized in that in a low rate test mode in which said semiconductor apparatus tests semiconductor memories of low operating rate, each of said plurality of banks of each memory block in said failure analysis memory is designated as an area in which is stored failure data of one of semiconductor memories under test that said testing apparatus tests at the same time, and failure data of each semiconductor memory under test is stored in the corresponding one bank.

2. The semiconductor memory testing apparatus according to claim 1, wherein said failure analysis memory comprises a plurality of failure analysis memory units the number of which is equal to the number of semiconductor memories of high operating rate that said testing apparatus can test at the same time in the high rate test mode, each of said failure analysis memory units comprising a group of input terminals the number of which corresponds to the number of ways of an interleave operations a memory control part, and a plurality of memory blocks the number of which is equal to the number of semiconductor memories of high operating rate that said testing apparatus can test at the same time in the high rate test mode, and wherein said memory control part includes failure format means the number of which corresponds to the number of ways of an interleave operation, and bank selector means for generating a bank select signal for selecting at least one bank from each of said plurality of memory blocks.

3. The semiconductor memory testing apparatus according to claim 2, wherein one input terminal of said input terminal group of said memory control part is directly connected to one of said failure format means, the remaining input terminals thereof are connected to the corresponding remaining failure format means through respective one input terminals of switching means, respectively, and said one input terminal of said input terminal group is also connected to respective the other input terminals of said switching means.

4. The semiconductor memory testing apparatus according to claim 3, wherein each input terminal of said input terminal group of said memory control part is supplied with low rate failure data of one of semiconductor memories under test that said testing apparatus tests at the same time in the low rate test mode, and said one input terminal of said input terminal group of said memory control part is supplied with high rate failure data of one of semiconductor memories under test that said testing apparatus tests at the same time in the high rate test mode.

5. The semiconductor memory testing apparatus according to claim 3, wherein each of said switching means is a multiplexer, and in the high rate test mode, the multiplexers connect only said one input terminal of said input terminal group to said remaining failure format means, and in the low rate test mode, the multiplexers connect said remaining input terminals of said input terminal group to said corresponding remaining failure format means, respectively.

* * * * *